United States Patent
Sekiya

(10) Patent No.: US 10,475,681 B2
(45) Date of Patent: Nov. 12, 2019

(54) CHIP ACCOMMODATION TRAY

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 86 days.

(21) Appl. No.: 15/373,795

(22) Filed: Dec. 9, 2016

(65) Prior Publication Data

US 2017/0186635 A1  Jun. 29, 2017

(30) Foreign Application Priority Data

Dec. 24, 2015  (JP) .................................. 2015-251182

(51) Int. Cl.
    *H01L 21/673* (2006.01)
    *H01L 21/683* (2006.01)
    *H01L 21/67*  (2006.01)

(52) U.S. Cl.
    CPC .. *H01L 21/67336* (2013.01); *H01L 21/67132* (2013.01); *H01L 21/67333* (2013.01); *H01L 21/6835* (2013.01); *H01L 21/6838* (2013.01)

(58) Field of Classification Search
    CPC ........... H01L 21/67336; H01L 21/6835; H01L 21/6838; H01L 21/67333; H01L 21/67132; B25B 11/00; B25B 11/005
    USPC ....... 206/701, 706, 710, 712, 562, 557, 565, 206/460, 713, 714, 722, 725; 269/289 R, 269/21, 903
    See application file for complete search history.

(56) References Cited

U.S. PATENT DOCUMENTS

| | | | | |
|---|---|---|---|---|
| 3,456,159 A | * | 7/1969 | Davis, Jr. .............. | H01L 21/705 174/253 |
| 4,381,321 A | * | 4/1983 | Braden .................... | B05D 1/00 427/101 |
| 4,859,498 A | * | 8/1989 | Yamaguchi .......... | H01C 17/281 118/500 |
| 4,989,845 A | * | 2/1991 | Kurita ............... | H01L 21/67333 269/21 |
| 5,173,766 A | * | 12/1992 | Long ....................... | H01L 21/50 257/668 |
| 5,337,893 A | * | 8/1994 | Nami ................. | H05K 13/0084 118/503 |
| 5,383,997 A | * | 1/1995 | Minowa ................. | B05C 13/02 118/423 |
| 6,029,427 A | * | 2/2000 | Freund .............. | H01L 21/67333 206/460 |

(Continued)

FOREIGN PATENT DOCUMENTS

JP  2001-239365  9/2001

*Primary Examiner* — Jacob K Ackun
*Assistant Examiner* — Jenine Pagan
(74) *Attorney, Agent, or Firm* — Greer Burns & Crain, Ltd.

(57) ABSTRACT

A chip accommodation tray for accommodating a plurality of chips includes a holding sheet for holding the chips on a face side thereof, the holding sheet having a tack force and a plurality of first pores formed therethrough, and a frame including a bottom wall supporting a reverse side of the holding sheet, the bottom wall having a plurality of second pores formed therethrough, and side walls erected from the bottom wall in surrounding relation to the holding sheet. Air is supplied from below the bottom wall of the frame through the second pores and the first pores and ejected toward lower surfaces of the chips held on the holding sheet, thereby peeling the chips off the holding sheet.

5 Claims, 8 Drawing Sheets

(56) References Cited

U.S. PATENT DOCUMENTS

| | | | | | |
|---|---|---|---|---|---|
| 6,215,098 | B1* | 4/2001 | Mizoi | .................... | B23K 26/40 219/121.71 |
| 6,488,158 | B1* | 12/2002 | Khan | ................ | H01L 21/67333 211/41.18 |
| 6,594,890 | B2* | 7/2003 | Arai | ........................ | B24B 7/228 29/426.1 |
| 6,759,274 | B2* | 7/2004 | Arai | ................. | H01L 21/67132 257/E21.599 |
| 7,588,150 | B2* | 9/2009 | Kasama | ............ | H01L 21/67346 206/303 |
| 8,034,652 | B2* | 10/2011 | Nishida | ............... | H01L 21/6835 438/294 |
| 9,459,315 | B2* | 10/2016 | Han | ................. | H01L 21/67333 |
| 9,487,344 | B2* | 11/2016 | Zweers | ............. | H01L 21/67336 |
| 2002/0025656 | A1* | 2/2002 | Arai | ................. | H01L 21/67132 438/463 |
| 2005/0173052 | A1* | 8/2005 | Mitarai | ................... | B29C 65/76 156/247 |
| 2006/0197260 | A1* | 9/2006 | Yoshikawa | ............ | B23K 26/10 264/482 |
| 2007/0045799 | A1* | 3/2007 | Sekiya | .............. | H01L 21/67132 257/678 |
| 2008/0110015 | A1* | 5/2008 | Sakai | ................ | H01L 21/67092 29/760 |
| 2009/0249604 | A1* | 10/2009 | Nakamura | ........ | H01L 21/67092 29/426.4 |
| 2011/0073776 | A1* | 3/2011 | Inoue | ................. | H01L 21/6838 250/492.1 |
| 2014/0262928 | A1* | 9/2014 | Han | .................. | H01L 21/67333 206/711 |
| 2014/0302755 | A1* | 10/2014 | Kumamoto | ......... | H01L 21/6838 451/388 |
| 2015/0214085 | A1* | 7/2015 | Jin | ...................... | H01L 21/6838 414/806 |
| 2015/0266197 | A1* | 9/2015 | Rochet | ................... | B26D 7/018 83/451 |

* cited by examiner

CHIP ACCOMMODATION TRAY

BACKGROUND OF THE INVENTION

Field of the Invention

The present invention relates to a chip accommodation tray for accommodating semiconductor chips or the like that have been diced by a dicing saw of a cutting apparatus or the like.

Description of the Related Art

In a semiconductor device fabrication process, it has been customary to form devices such as integrated circuits (ICs) and large scale integrations (LSIs), in a multiplicity of areas arranged in a grid pattern on the surface of a substantially disk-shaped semiconductor wafer, and cut the semiconductor wafer along projected dicing lines demarcating the areas with the devices formed therein into individual semiconductor chips. The semiconductor chips thus divided are then packaged and widely used in electric devices including mobile phones and personal computers.

There have been demands for lighter and smaller electric devices including mobile phones and personal computers, and packaging technologies have been developed to produce smaller packages to be used for packaging semiconductor chips, referred to as chip-size packages (CSP). One type of CSP that has been put to practical use is called Quad Flat Non-lead (QFN) package. The QFN packages are produced as follows: A plurality of semiconductor chips are arranged in a matrix on a metal plate such as a copper plate which includes a plurality of connection terminals corresponding to the connection terminals of the semiconductor chips and a plurality of projected dicing lines formed in a grid pattern to demarcate the metal plate into areas so as to be aligned with the semiconductor chips, respectively. The metal plate and the semiconductor chips are integrally combined with each other by a resin layer molded on the reverse sides of the semiconductor chips, thereby producing a CSP board as a package board. The package board is then cut along the projected dicing lines into individually packaged chip-size packages.

The package board is cut generally by a cutting apparatus having a cutting blade. The cutting apparatus is provided with a jig that has, in regions corresponding to the projected dicing lines, clearance grooves formed in a grid pattern for clearing the cutting edge of the cutting blade, and has suction holes provided respectively in a plurality areas demarcated by the clearance grooves. The package board is held under suction by the jig that has been positioned on a holding table, and while the cutting blade is rotating, the holding table is moved relatively to the package board along the projected dicing lines on the package board, cutting the package board along the projected dicing lines into individual chip-size packages. Thereafter, the divided individual chip-size packages are accommodated in a chip accommodation tray having a plurality of accommodation compartments, and then transported to an assembling step (see, for example, Japanese Patent Laid-open No. 2001-239365).

SUMMARY OF THE INVENTION

The accommodation compartments in the chip accommodation tray are demarcated by partitions to a size corresponding to the size of the chips, i.e., the chip-size packages. Therefore, if chip-size packages of different sizes are to be handled, then it is necessary to provide as many types of chip accommodation trays as the different sizes of the chip-size packages. However, it would be tedious and time-consuming to manage all those chip accommodation trays.

It is therefore an object of the present invention to provide a chip accommodation tray which is capable of accommodating chips regardless of their sizes, allows chips to be transferred thereto efficiently from a jig, and makes it easy for accommodated chips to be picked up.

In accordance with an aspect of the present invention, there is provided a chip accommodation tray for accommodating a plurality of chips, including a holding sheet for holding the chips on a face side thereof, the holding sheet having a tack force and a plurality of first pores formed therethrough, and a frame having a bottom wall supporting a reverse side of the holding sheet, the bottom wall having a plurality of second pores formed therethrough, and side walls erected from the bottom wall in surrounding relation to the holding sheet. In the chip accommodation tray, air is supplied from below the bottom wall of the frame through the second pores and the first pores and ejected toward lower surfaces of the chips held on the holding sheet, thereby peeling the chips off the holding sheet.

The chip accommodation tray according to the present invention has the holding sheet having the tack force and holding the chips on the face side thereof, and the frame including the bottom wall supporting the reverse side of the holding sheet and the side walls erected from the bottom wall in surrounding relation to the holding sheet. Consequently, the chip accommodation tray does not need to have a plurality of accommodation compartments demarcated so as to correspond respectively to the individual chips, and hence it is not necessary to provide as many types of trays as the different sizes of individual chips. Therefore, only one type of chip accommodation tray is capable of dealing with various types of chips, and the management of the chip accommodation tray is greatly simplified.

In the chip accommodation tray according to the present invention, the holding sheet and the bottom wall of the frame have the pores formed therethrough in alignment with each other, and the pores formed in the holding sheet are open at the face side thereof. Air is supplied from below the bottom wall through the pores and ejected toward the lower surfaces of the chips held on the holding sheet, thereby peeling the chips off the holding sheet. When a chip held on the holding sheet under the tack force is to be picked up, the chip can easily be peeled off the holding sheet by supplying air to the pores that correspond to the chip to be picked up.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1A:
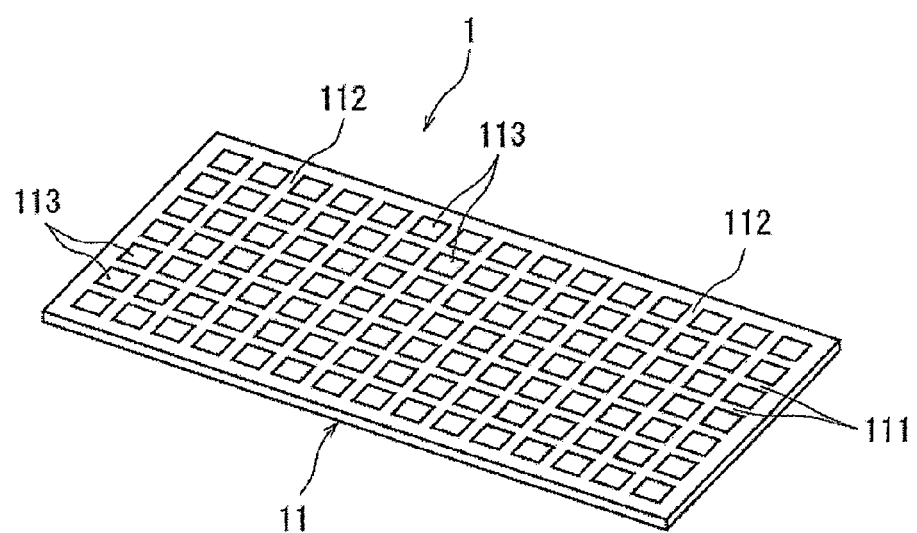
FIG. 1A is a perspective view of a package board as a workpiece.
Figure 1B:
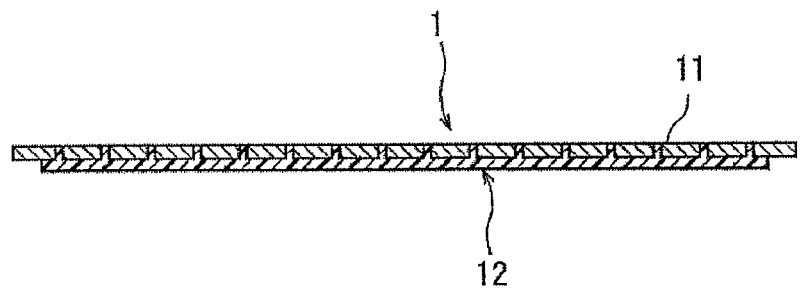
FIG. 1B is a cross-sectional view of the package board.

A chip accommodation tray constructed according to an embodiment of the present invention will be described in detail below with reference to the accompanying drawings. FIGS. 1A and 1B are perspective and cross-sectional views, respectively, of a package board 1 as a workpiece. The package board 1 includes a metal plate 11 having, on a face side 11a thereof, a grid pattern of a plurality of first projected dicing lines 111 extending in a prescribed direction and a plurality of second projected dicing lines 112 extending in a direction perpendicular to the first projected dicing lines 111. Chips 113 are disposed respectively in a plurality of areas demarcated by the first projected dicing lines 111 and the second projected dicing lines 112. The chips 113 are supported by a synthetic resin layer 12 molded on a reverse side of the metal plate 11. The package board 1 thus formed is cut along the first projected dicing lines 111 and the second projected dicing lines 112 into individual packaged chips, i.e., chip-size packages, 113.

Figure 2A:
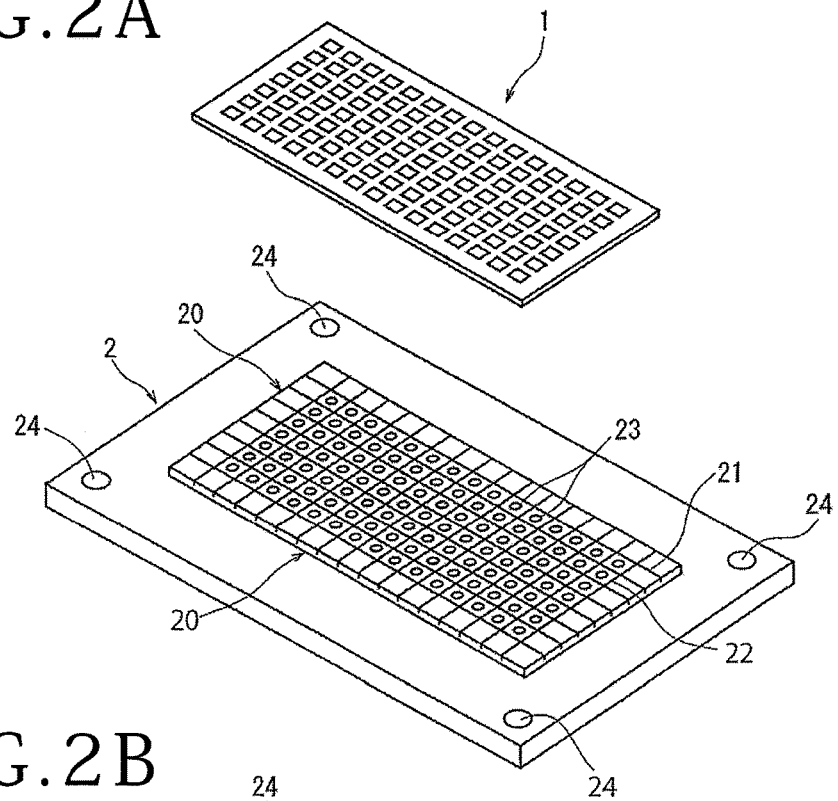
FIG. 2A is a perspective view of a holding jig for holding the package board illustrated in FIGS. 1A and 1B.
Figure 2B:
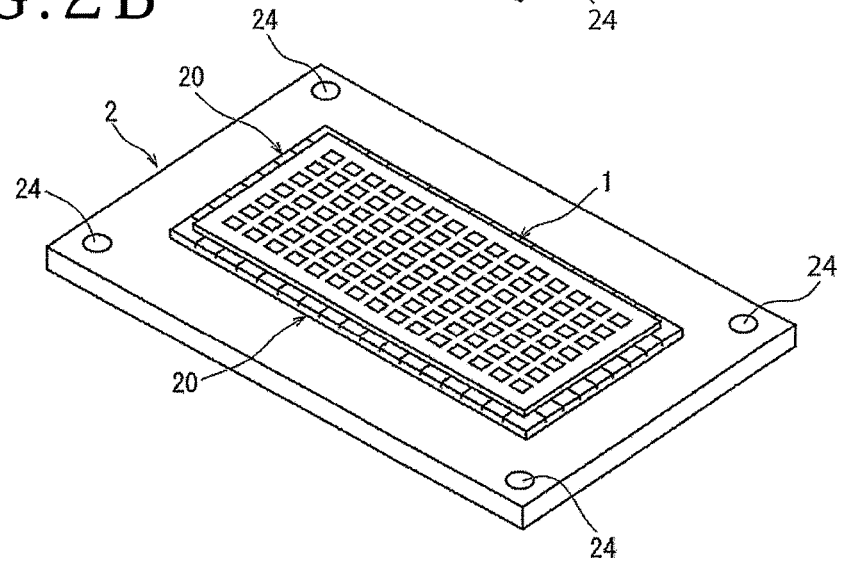
FIG. 2B is a perspective view illustrating the manner in which the holding jig holds the package board.

For cutting the package board 1 along the first projected dicing lines 111 and the second projected dicing lines 112, the package board 1 is held by a holding jig 2 as illustrated in FIGS. 2A and 2B. As illustrated in FIG. 2A, the holding jig 2 is of a rectangular shape and has a suction holder 20 protruding centrally on a face side thereof for holding the package board 1 under suction. The suction holder 20 has, on an upper surface (holding surface) thereof, a grid pattern of clearance grooves 21 and 22 for clearing the cutting edge of a cutting blade to be described later, the grid pattern which is formed in regions corresponding to the first projected dicing lines 111 and the second projected dicing lines 112 on the package board 1. The suction holder 20 also has a plurality of suction holes 23 formed in respective areas demarcated by the clearance grooves 21 and 22 and held in fluid communication with suction means, not shown. The holding jig 2 has positioning holes 24 provided in respective four corners thereof. On the holding jig 2 thus constructed, the package board 1 is placed on the upper surface (holding surface) of the suction holder 20, as illustrated in FIG. 2B.

A cutting apparatus for cutting the package board 1 placed on the holding jig 2 described above along the first projected dicing lines 111 and the second projected dicing lines 112 will be described below with reference to FIG. 3. The cutting apparatus 3 illustrated in FIG. 3 has an apparatus housing 31 substantially in the shape of a rectangular parallelepiped. The apparatus housing 31 houses therein a suction table 32 for holding a workpiece, and the suction table 32 is movable in directions, which may also be referred to as "cutting feed directions", indicated by the arrow X. The suction table 32 has a suction recess 321 provided in an upper surface thereof where a suction port 322 held in communication with suction means, not shown, is open. The suction table 32 has upstanding positioning pins 323 disposed on its upper surface at respective four corners thereof for fitting in the respective positioning holes 24 in the four corners of the holding jig 2. The suction table 32 is rotatable about its own axis by a rotating mechanism, not shown. The suction table 32 thus constructed is movable in the cutting feed directions indicated by the arrow X by cutting feed means, not shown.

The cutting apparatus 3 has a spindle unit 33 as cutting means. The spindle unit 33 is movable in indexing feed directions indicated by the arrow Y in FIG. 3 by indexing feed means, not shown, and is also movable in incising feed directions indicated by the arrow Z in FIG. 3 by incising feed means, not shown. The spindle unit 33 includes: a spindle housing 331 mounted on a movable base, not shown, for adjusting movement in the indexing feed directions indicated by the arrow Y and the incising feed directions indicated by the arrow Z; a rotary spindle 332 rotatably supported on the spindle housing 331; and a cutting blade 333 mounted on a front end of the rotary spindle 332.

The cutting apparatus 3 also includes image capturing means 34 for capturing an image of the surface of a workpiece held on the suction table 32 and detecting an area to be cut by the cutting blade 333 from the captured image. The image capturing means 34 includes an optical system having a microscope and an image capturing device (charge-coupled device (CCD)), and sends a captured image signal to control means, not shown.

Figure 3:
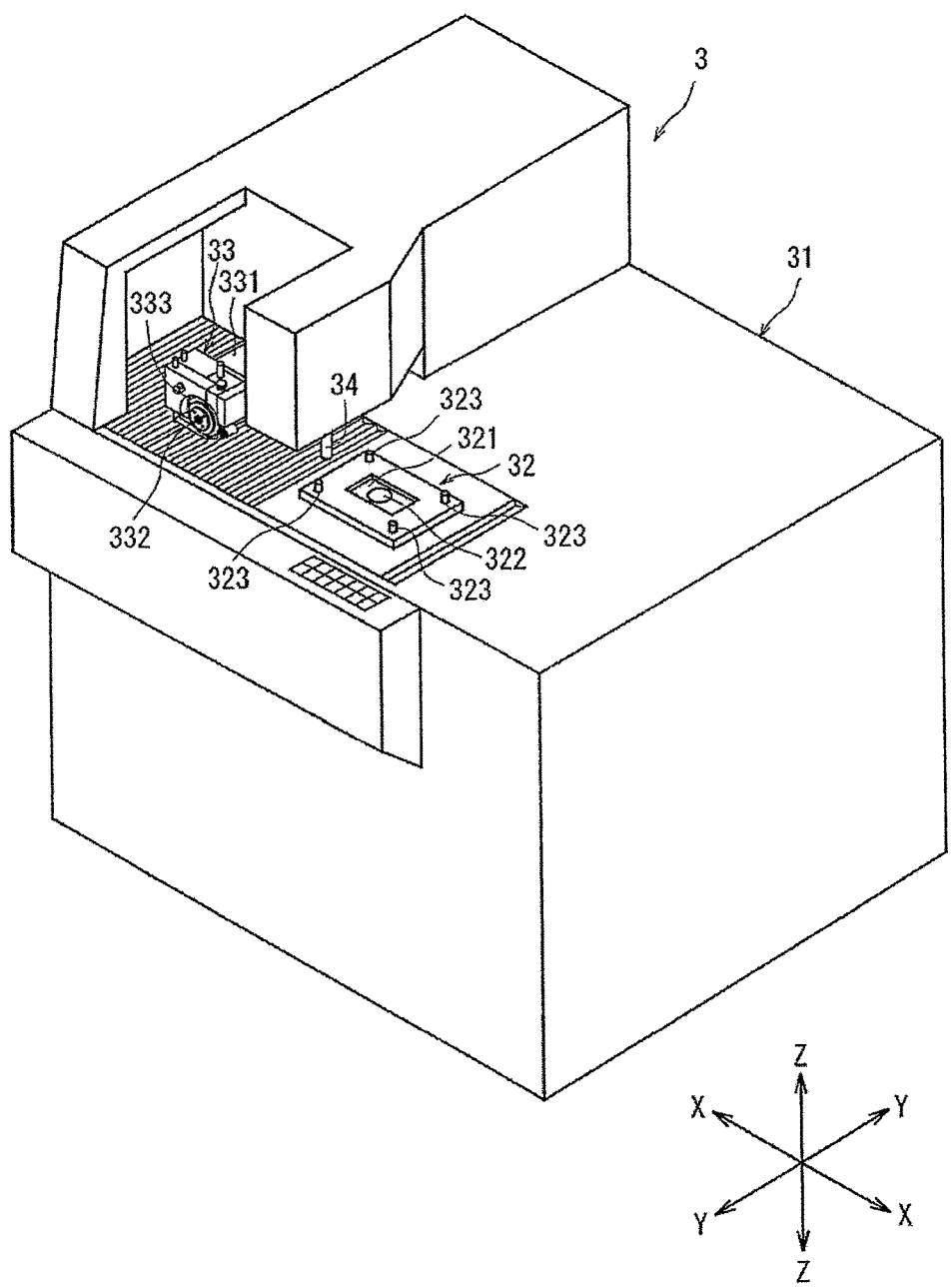
FIG. 3 is a perspective view of a cutting apparatus for dividing the package board illustrated in FIGS. 1A and 1B into individual chips.

The cutting apparatus 3 illustrated in FIG. 3 is of the construction described above. A cutting operation for cutting the package board 1 along the first projected dicing lines 111 and the second projected dicing lines 112 on the cutting apparatus 3 will be described below. First, the holding jig 2 with the package board 1 placed thereon is placed on the suction table 32 of the cutting apparatus 3. At this time, the positioning holes 24 provided in the four corners of the holding jig 2 are fitted over the respective positioning pins 323 disposed on the four corners of the suction table 32, thereby positioning the holding jig 2 with the package board 1 placed thereon at a prescribed position. Then, the suction means, not shown, is actuated to apply a negative pressure to each of the chips 113 of the package board 1 placed on the suction holder 20 of the holding jig 2, through the suction port 322 and suction recess 321 of the suction table 32, and the suction holes 23 provided in the holding jig 2, holding each of the chips 113 of the package board 1 under suction on the suction holder 20 of the holding jig 2 (package board holding step).

After the above package board holding step has been carried out, the cutting feed means, not shown, is actuated to move the holding jig 2 with the package board 1 held thereon to a position directly below the image capturing means 34. When the holding jig 2 is positioned directly below the image capturing means 34, an alignment operation is performed to detect processing areas to be cut of the package board 1 with the image capturing means 34 and the non-illustrated control means. In the alignment operation, the image capturing means 34 and the non-illustrated control means carry out an image processing such as pattern matching to position the first projected dicing lines 111 formed in a prescribed direction on the package board 1 with the cutting blade 333 for cutting the package board 1 along the first projected dicing line 111, for thereby detecting processing areas to be cut of the package board 1. The alignment operation is also carried out to position the second projected dicing lines 112 extending in a direction perpendicular to the first projected dicing lines 111 formed in the prescribed direction on the package board 1 with the cutting blade 333, for thereby detecting processing areas to be cut of the package board 1.

Figure 4A:
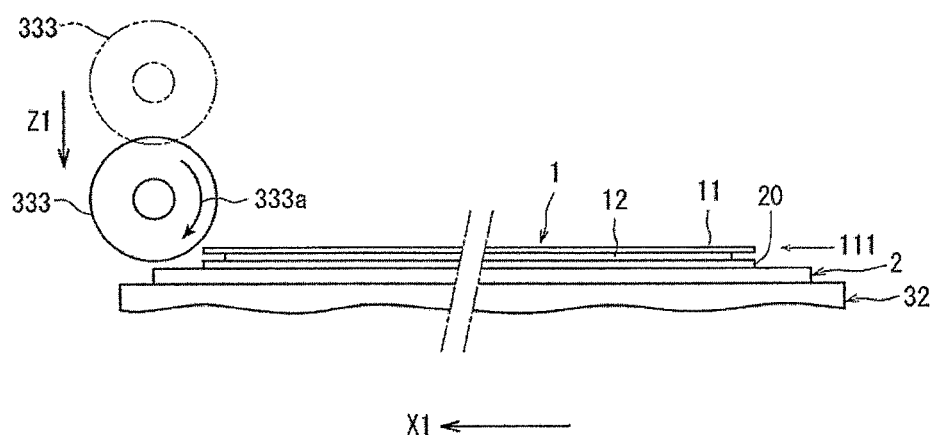
FIGS. 4A and 4B are fragmentary views illustrating a cutting step which is carried out by the cutting apparatus illustrated in FIG. 3.
Figure 4B:
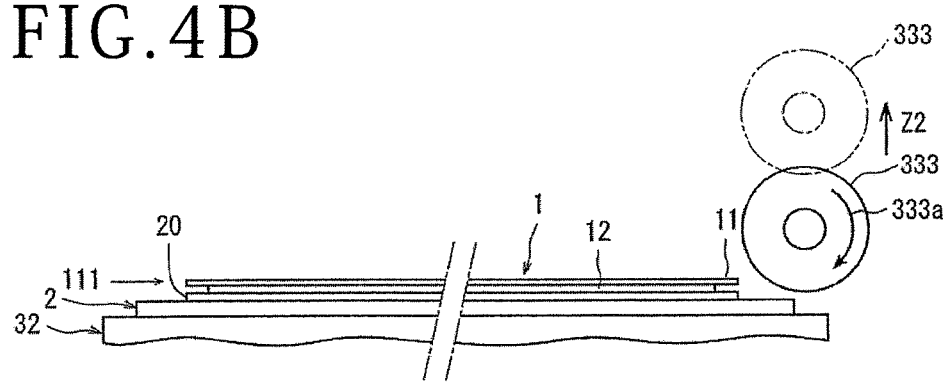

After the alignment operation for detecting processing areas to be cut of the package board 1 has been carried out, the holding jig 2 is moved to a cutting area to position one end of the prescribed first projected dicing lines 111 at a position that is slightly on the right side of the position directly below the cutting blade 333, as illustrated in FIG. 4A. Then, while the cutting blade 333 is rotating in a direction indicated by the arrow 333a, the incising feed means, not shown, is actuated to incising-feed the cutting blade 333 by a prescribed distance in the direction indicated by the arrow Z1, thus positioning the cutting blade 333 at a prescribed incising depth. The incising depth is set to a position where the outer circumferential edge of the cutting edge of the cutting blade 333 reaches one of the clearance grooves 21 (see FIG. 2A) formed in the suction holder 20 of the holding jig 2. Then, the non-illustrated cutting feed means is actuated to move the suction table 32 at a prescribed cutting feed speed in the direction indicated by the arrow X1, as illustrated in FIG. 4A. When the other end of the first projected dicing line 111 on the package board 1 held on the suction table 32 by the holding jig 2 reaches a position that is slightly on the left side of the position directly below the cutting blade 333, as illustrated in FIG. 4B, the cutting feed means stops moving the suction table 32, and the incising feed means lifts the cutting blade 333 in the direction indicated by the arrow Z2. Then, the indexing feed means is actuated to indexing-feed the holding jig 2 to bring a next one of the first projected dicing lines 111 into alignment with the cutting blade 333, after which the above cutting operation is repeated. As a result, the package board 1 is cut along all the first projected dicing lines 111 (first cutting step).

After the package board 1 has been cut along all the first projected dicing lines 111 in the first cutting step, the suction table 32 is turned 90°, orienting the second projected dicing lines 112 formed on the package board 1 held on the suction table 32 by the holding jig 2 in alignment with the cutting feed directions indicated by the arrow X. Then, the above first cutting step is carried out on the package board 1 to cut the package board 1 along all the second projected dicing lines 112 (second cutting step).

In the first cutting step and the second cutting step, the package board 1 is cut along the first projected dicing lines 111 and the second projected dicing lines 112 into individually packaged chips, i.e., chip-size packages, 113. The individual packaged chips or chip-size packages 113 thus divided remain held under suction on the suction holder 20 of the holding jig 2.

The divided chips or chip-size packages 113 are then accommodated in a chip accommodation tray to be described below and transferred to a next assembling step. A chip accommodation tray 5 according to the embodiment of the present invention will now be described below with reference to FIGS. 6, 7A, and 7B. The chip accommodation tray 5 includes a rectangular holding sheet 51 for holding a plurality of chips on its face side and a rectangular frame 52 that supports the holding sheet 51 therein. The holding sheet 51 is in the form of a sheet having a tack force for holding a plurality of chips on its face side, i.e., upper surface, under the tack force. The sheet having a tack force may be made of "SEPALESS" (trade name) or "HANDY ECOTACK" (trade name) manufactured and sold by New Tack Kasei Co., Ltd.

Figure 6:
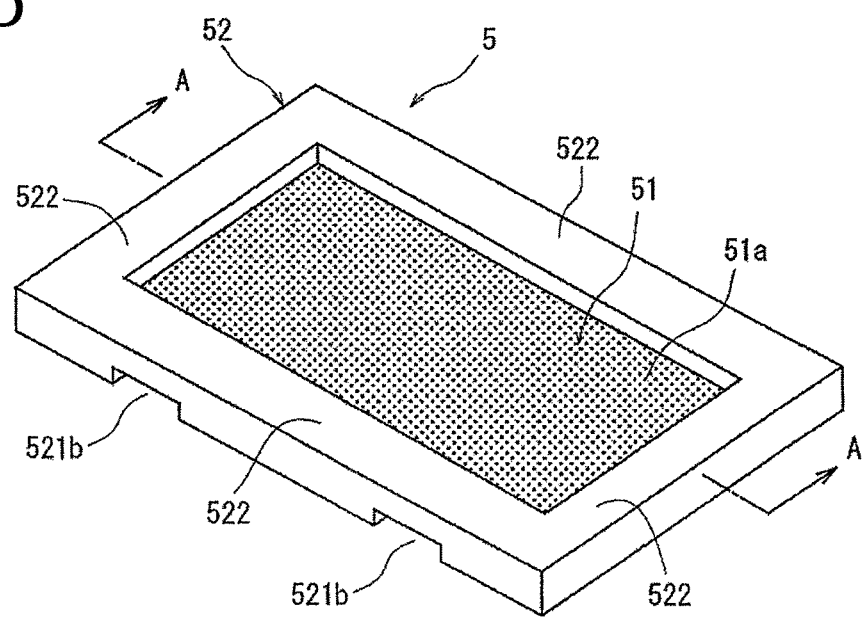
FIG. 6 is a perspective view of a chip accommodation tray according to an embodiment of the present invention.
Figure 7A:
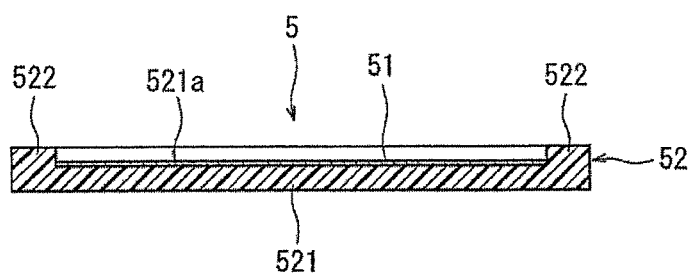
FIG. 7A is a cross-sectional view taken along line A-A of FIG. 6.
Figure 7B:
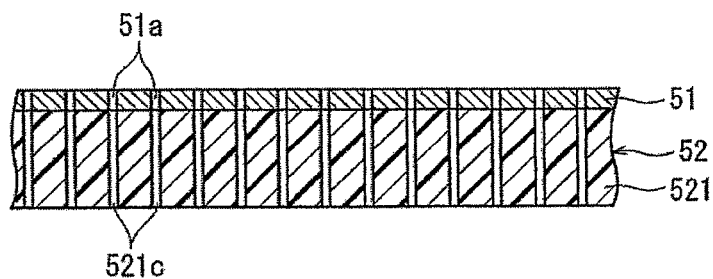
FIG. 7B is an enlarged fragmentary cross-sectional view of the chip accommodation tray illustrated in FIG. 7A.

The frame 52 has a bottom wall 521 having a support surface 521a supporting the reverse side, i.e., lower surface, of the holding sheet 51 and four side walls 522 erected from the bottom wall 521 in surrounding relation to the holding sheet 51. The bottom wall 521 has two engaging cavities 521b provided in its lower surface on both sides in transverse directions thereof, for engaging support members of a transporting apparatus, not shown. Only the engaging cavities 521b on one side are illustrated in FIG. 6. As illustrated in FIG. 7B, the holding sheet 51 has a plurality of pores 51a formed therethrough which are open at the face side thereof, and the bottom wall 521 of the frame 52 has a plurality of pores 521c formed therethrough in alignment with the respective pores 51a. The pores 51a and 521c may be formed through the bottom wall 521 of the frame 52 by a laser beam that is applied from the face side of the holding sheet 51.

Figure 5:
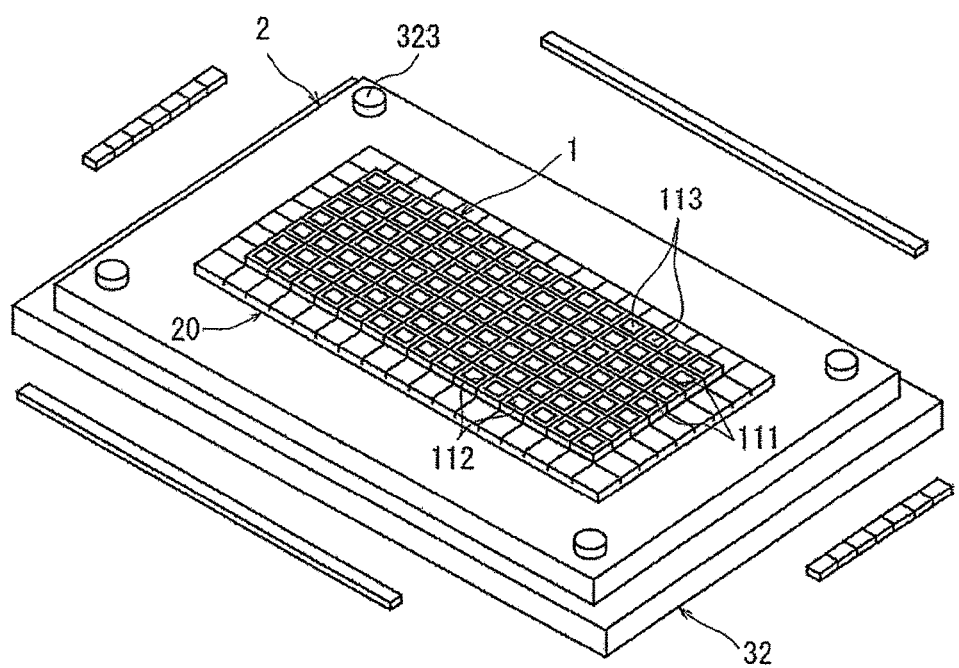
FIG. 5 is a perspective view illustrating the manner in which the package board is divided into individual chips in the cutting step illustrated in FIGS. 4A and 4B.

A method of accommodating the individually divided chips or chip-size packages 113 illustrated in FIG. 5 into the chip accommodation tray 5 from the suction holder 20 of the holding jig 2 will be described below with reference to FIGS. 8A through 8C. According to the present embodiment, the chips 113 are accommodated into the chip accommodation tray 5 from the suction holder 20 of the holding jig 2, using a chip transporting apparatus 6. The chip transporting apparatus 6 is provided with a suction holder pad 61 for holding a plurality of chips 113 under suction and a transporting arm 62 supporting the suction holder pad 61 on one end thereof. The transporting arm 62 is actuatable by an actuating mechanism, not shown. The suction holder pad 61 includes a pad body 611 having a rectangular recess 611a provided in a lower surface thereof and having a size similar to the package board 1 with the chips 113 formed therein, and an attraction pad 612 fitted in the recess 611a of the pad body 611. The pad body 611 has a suction port 611b provided centrally therein which is held in fluid communication with the recess 611a. The suction port 611b is held in fluid communication with suction means, not shown. The attraction pad 612 is of a rectangular shape and has a plurality of suction holes 612a provided therein at positions corresponding to the chips 113, as with the suction holes 23 provided in the suction holder 20 of the holding jig 2. Therefore, when the non-illustrated suction means is actuated, the suction means applies a negative pressure through the suction port 611b and the recess 611a to the suction holes 612a.

Figure 8A:
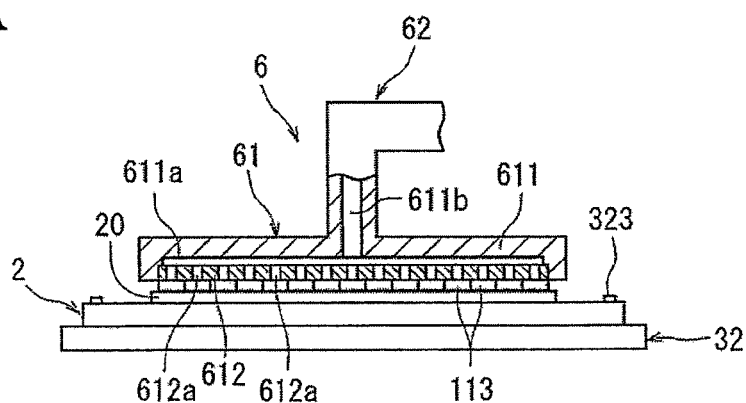
FIGS. 8A through 8C are views illustrating the manner in which the chips illustrated in FIG. 5 are transferred to the chip accommodation tray illustrated in FIG. 6.

For accommodating the chips 113 into the chip accommodation tray 5 from the suction holder 20 of the holding jig 2, using the chip transporting apparatus 6, the non-illustrated actuating mechanism is actuated to position the lower surface of the attraction pad 612 of the suction holder pad 61 on the upper surfaces of the chips 113 placed on the suction holder 20 of the holding jig 2, as illustrated in FIG. 8A. The suction means held in fluid communication with the suction table 32 is inactivated, and the non-illustrated suction means held in fluid communication with the suction port 611b of the suction holder pad 61 is actuated to apply a negative pressure through the suction port 611b and the recess 611a to the suction holes 612a in the attraction pad 612. As a result, the chips 113 are held under suction to the suction holes 612a in the attraction pad 612.

Figure 8B:
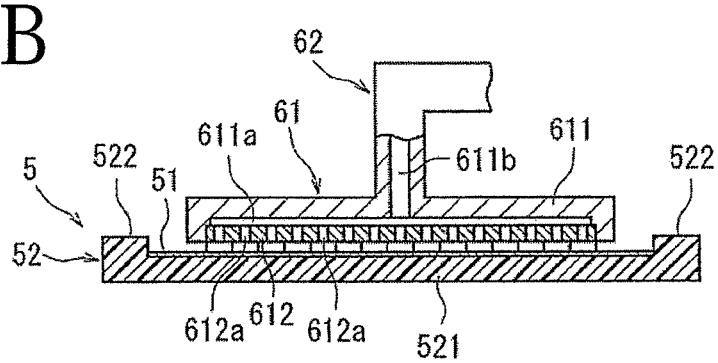
Figure 8C:
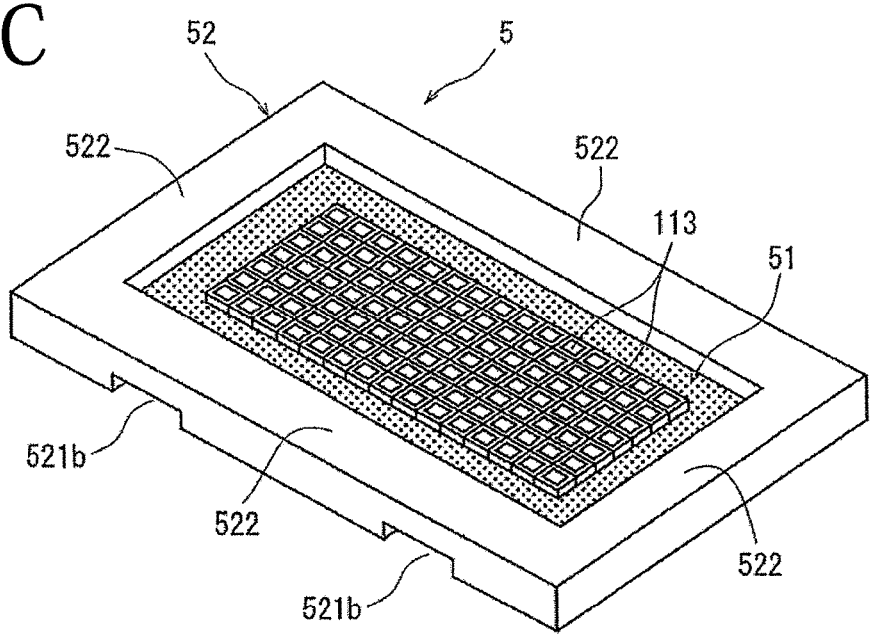

After the chips 113 have been held under suction to the suction holes 612a in the attraction pad 612, the non-illustrated actuating mechanism is actuated to transport the suction holder pad 61 to a position over the chip accommodation tray 5 as illustrated in FIG. 8B, and the lower surfaces of the chips 113 held under suction by the lower surface (attraction surface) of the attraction pad 612 are placed on the holding sheet 51 supported on the support surface 521a of the bottom wall 521 of the frame 52. Then, the non-illustrated suction means is disabled, and the non-illustrated actuating mechanism is actuated to retract the suction holder pad 61 away from the chip accommodation tray 5. As a result, as illustrated in FIG. 8C, the chips 113 are transferred onto the holding sheet 51 which has the tack force and is supported on the support surface 521a of the bottom wall 521 constituting the chip accommodation tray 5. The chips 113 transferred to the holding sheet 51 of the chip accommodation tray 5 remain held in position against falling off due to the tack force of the holding sheet 51.

As described above, since the chip accommodation tray 5 according to the present invention includes the holding sheet 51 having the tack force and supported on the supporting surface 521a of the bottom wall 521 of the frame 52, the chip accommodation tray 5 does not need to have a plurality of accommodation compartments demarcated so as to correspond respectively to the individual chips 113, and hence it is not necessary to provide as many types of trays as the different sizes of individual chips. Therefore, only one type of chip accommodation tray 5 is capable of dealing with various types of chips 113, and the management of the chip accommodation tray 5 is greatly simplified. Furthermore, as the holding sheet 51 having the tack force is supported on the supporting surface 521a of the bottom wall 521 of the frame 52, it is possible to transfer the chips 113 altogether from the suction holder 20 of the holding jig 2 with the device transporting apparatus 6, resulting in an increase in the productivity of the chips 113.

Figure 9A:
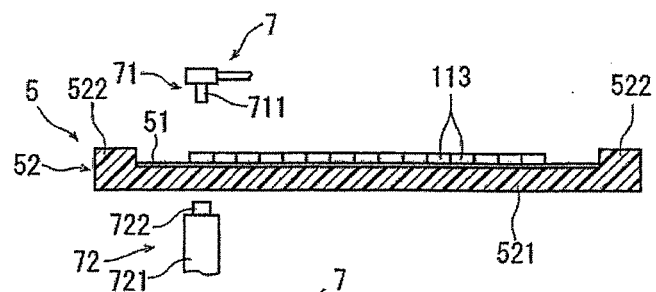
FIGS. 9A through 9C are views illustrating the manner in which the chips transferred to the chip accommodation tray as illustrated in FIG. 8C are picked up.

The chips 113 thus accommodated in the chip accommodation tray 5 are then transported to an assembling step. In the assembling step, the chips 113 are picked up one by one by a pickup apparatus 7 illustrated in FIG. 9A (pickup step). As illustrated in FIG. 9A, the pickup apparatus 7 includes pickup means 71 disposed above the chip accommodation tray 5 and movable to positions corresponding to the chips 113 held in the chip accommodation tray 5, and air ejecting means 72 disposed below the chip accommodation tray 5 and movable to positions corresponding to the chips 113 held in the chip accommodation tray 5 in synchronism with the pickup means 71. The pickup means 71 includes a pickup collet 711 for holding the chips 113 under suction, the pickup collet 711 being connected to suction means, not shown. The air ejecting means 72 includes an air ejecting tube 722 vertically movable by an air cylinder 721, the air ejecting tube 722 being connected to air supply means, not shown.

Figure 9B:
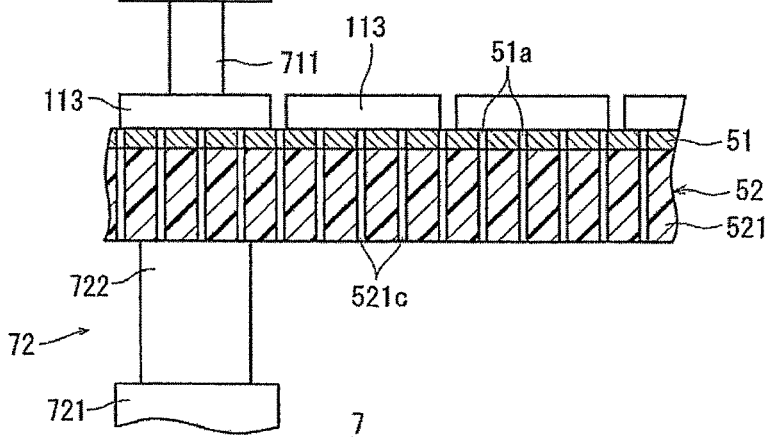

For carrying out the pickup step using the pickup apparatus 7 illustrated in FIG. 9A, the pickup means 71 and the air ejecting means 72 are actuated to position the pickup collect 711 on the upper surface of a chip 113 to be picked up and to position the air ejecting tube 722 on the lower surface of the bottom wall 521 constituting the chip accommodation tray 5 in alignment with the chip 113 to be picked up, as illustrated in FIG. 9B. Then, the non-illustrated suction means connected to the pickup means 71 is actuated to apply a negative pressure to the pickup collect 711 to hold the upper surface of the chip 113 to be picked up under suction, and the non-illustrated air supply means connected to the air ejecting means 72 is actuated to supply air to the air ejecting tube 722.

Figure 9C:
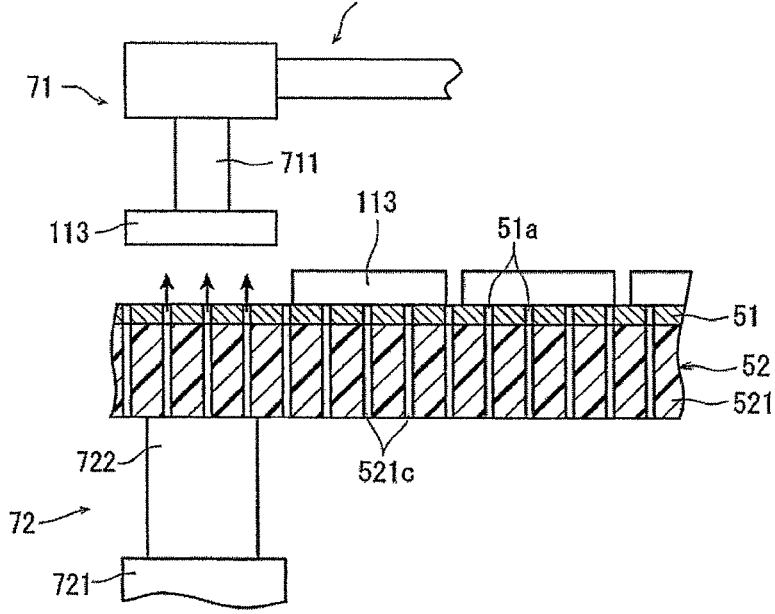

As a result, the air supplied to the air ejecting tube 722 is ejected toward the lower surface of the chip 113 to be picked up through the pores 521c formed in the bottom wall 521 of the frame 52 of the chip accommodation tray 5 and the pores 51a formed in the holding sheet 51. Accordingly, when the pickup collet 711 of the pickup means 71 is moved upwardly, the chip 113 to be picked up that has been held under the tack force on the surface of the holding sheet 51 is easily peeled off due to the air ejected to the lower surface of the chip 113, as illustrated in FIG. 9C.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A chip accommodation tray for accommodating a plurality of chips, comprising:
   a holding sheet for holding the chips on a face side thereof, the holding sheet having a tack force and a plurality of first pores formed therethrough, wherein the plurality of first pores are configured and arranged such that when the chips are accommodated in the tray, each of the chips is positioned on a plurality of the first pores; and
   a frame including a bottom wall supporting a reverse side of the holding sheet, the bottom wall having a plurality of second pores formed therethrough, and side walls erected from the bottom wall in surrounding relation to the holding sheet;
   wherein air supplied from below the bottom wall of the frame through the second pores and the first pores is ejected toward lower surfaces of the chips held on the holding sheet, thereby peeling the chips off the holding sheet.

2. The chip accommodation tray according to claim 1, wherein said frame and said bottom wall are formed of the same material.

3. The chip accommodation tray according to claim 1, wherein said frame and said bottom wall are integrally formed as a single component.

4. The chip accommodation tray according to claim 1, wherein said reverse side of the holding sheet is supported in its entirety by said bottom wall of said frame.

5. The chip accommodation tray according to claim 1, wherein said bottom wall of said frame includes a first pair of engaging cavities along one side thereof and a second pair of engaging cavities along an opposite side thereof, wherein said engaging cavities are configured and arranged for engaging support members of a transporting apparatus.

* * * * *